(12) United States Patent
Shi et al.

(10) Patent No.: US 9,117,912 B2
(45) Date of Patent: Aug. 25, 2015

(54) IGZO TRANSISTOR STRUCTURE AND MANUFACTURING METHOD FOR THE SAME

(71) Applicant: Shenzhen China Star Optoelectronics Technology Co., Ltd., Shenzhen, Guangdong (CN)

(72) Inventors: Longqiang Shi, Shenzhen (CN); Chihyuan Tseng, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 14/131,683

(22) PCT Filed: Dec. 17, 2013

(86) PCT No.: PCT/CN2013/089623
§ 371 (c)(1),
(2) Date: Jan. 9, 2014

(65) Prior Publication Data
US 2015/0171225 A1 Jun. 18, 2015

(51) Int. Cl.
*H01L 21/00* (2006.01)
*H01L 21/84* (2006.01)
*H01L 29/786* (2006.01)
*H01L 27/12* (2006.01)
*H01L 29/66* (2006.01)
*H01L 21/02* (2006.01)
*H01L 21/425* (2006.01)

(52) U.S. Cl.
CPC .... *H01L 29/78606* (2013.01); *H01L 21/02164* (2013.01); *H01L 21/02271* (2013.01); *H01L 21/02565* (2013.01); *H01L 21/425* (2013.01); *H01L 27/1288* (2013.01); *H01L 29/66969* (2013.01); *H01L 29/7869* (2013.01)

(58) Field of Classification Search
CPC ............ H01L 27/1214; H01L 27/3274; H01L 29/0847; H01L 29/41733; H01L 29/42384; H01L 29/4908; H01L 29/7831; H01L 29/7869; H01L 2924/13069
See application file for complete search history.

(56) References Cited

U.S. PATENT DOCUMENTS

2014/0084283 A1* 3/2014 Lim et al. .......... 257/43

* cited by examiner

*Primary Examiner* — Hoai V Pham
(74) *Attorney, Agent, or Firm* — Andrew C. Cheng

(57) ABSTRACT

The present invention provides an IGZO transistor and a manufacturing method for the same. Wherein, the method comprises forming a source electrode, a drain electrode, and an IGZO layer on a substrate; forming a protect layer at a channel of the IGZO layer; performing N-type doping to a contact region of the source/drain electrodes and the IGZO layer to form a n+IGZO region through plasma treatment; and forming a gate insulation layer and a gate electrode. The IGZO transistor structure and method for the same provided by the present invention can prevent the channel of the IGZO layer from damage during N-type doping through the plasma treatment. It can improve the ohmic contact and increase device characteristics.

5 Claims, 4 Drawing Sheets

IGZO TRANSISTOR STRUCTURE AND MANUFACTURING METHOD FOR THE SAME

The claims of this application have submitted to the State Intellectual Property Office of the People's Republic of China (SIPO) on Dec. 9, 2013, Application No. 201310657960.0. The priority right based on the China application has a title of "IGZO transistor structure and manufacturing method for the same". The entire contents of the above-mentioned patent application will be incorporated in the present application through citing.

BACKGROUND OF THE INVENTION

1. Field of the Invention

The present invention relates to the image display field, and more particular to an IGZO transistor structure and manufacturing method for the same.

2. Description of Related Art

The thin-film field-effect transistor (TFT) based on oxide semiconductor is a hot spot for the display field in the future, and in recent years, it has been widely studied and developed. Wherein, the amorphous indium gallium zinc oxide (a-IGZO) compound film as the active channel has a high mobility up to 80 cm2/Vs (the mobility of the amorphous silicon (a-Si) is only 0.5~0.8 cm2/Vs), and it is compatible with the large scale and mass production process for the a-Si. Therefore, the indium gallium zinc oxide (IGZO) semiconductor has potential application for next-generation LCD and organic light emitting diode (OLED).

When a metal is contacting with IGZO, the semiconductor energy band at the interface is bend, which forms the potential barrier. The existence of the potential barrier will result in a large interface resistance, i.e., the Schottky contact. The Schottky resistance will cause insufficient current at on-state of a TFT component and too large sub-threshold swing, and decreasing the stability of the component in order to affect the display quality. Therefore, to reduce the contact resistance of the metal and the IGZO to form the ohmic contact is an important factor in determining the quality a semiconductor element. One way to form a good ohmic contact with the semiconductor region is performing heavy doping at the semiconductor region contacted with the metal such that the depletion region of the interface is narrowed and the electrons have more opportunities for direct tunneling (tunneling effect)

FIG. 1 shows a standard top-gate-bottom-contact structure for a TFT, and includes a substrate 1', a source electrode 2', a drain electrode 3', a gate electrode 4', an insulation layer 5', and an IGZO layer 6'. FIG. 2 is a schematic diagram of the top-gate-bottom-contact structure through heavy doping, wherein a contact region of the source/drain electrodes and IGZO layer 6' forms a n+IGZO region 7'.

However, in the conventional manufacturing method, in particular by the method of plasma treatment to perform the N-type doping on IGZO layer, it ignores the protection of the channel of the IGZO layer so that it is easily damage the channel of the IGZO layer in order to affect the performance of the ohmic contact.

SUMMARY OF THE INVENTION

The main object of the present invention is to provide an IGZO transistor structure and a manufacturing method for the same to avoid the channel of the IGZO layer from damage during N-type doping for the IGZO layer through plasma treatment.

In order to solve the above technical problems, a technical solution provided by the present invention is: a manufacturing method for an indium gallium zinc oxide (IGZO) transistor, comprising: forming a source electrode, a drain electrode, and an IGZO layer on a substrate; forming a protect layer at a channel of the IGZO layer; performing N type doping to a contact region of the source/drain electrode and the IGZO layer to form a n+IGZO region through plasma treatment; and forming a gate insulation layer and a gate electrode.

Wherein, in the step of forming a protect layer at a channel of the IGZO layer, further comprises: depositing a silicon oxide thin film on the source/drain electrodes and the IGZO layer using CVD (Chemical Vapor Deposition); coating a photoresist on the silicon oxide thin film; exposing and developing under a mask; etching a region which are not protected by the photoresist; and removing the photoresist to form the protect layer.

In order to solve the above technical problems, another technical solution provided by the present invention is: a manufacturing method for an indium gallium zinc oxide (IGZO) transistor, comprising: forming a source electrode and a drain electrode on a substrate; forming an IGZO layer on the source/drain electrodes and coating a photoresist; utilizing a half-tone mask to perform exposure for the photoresist to form a protective photoresist at a channel of the IGZO layer; performing plasma treatment at a contact region of the source/drain electrodes and the IGZO layer to form a n+IGZO region; and forming a gate insulation layer and a gate electrode.

Wherein, in the step of utilizing a half-tone mask to perform exposure for the photoresist to form a protective photoresist at a channel of the IGZO layer, further comprises: utilizing the half-tone mask to expose a portion of the photoresist at a contact region of the source/drain electrodes and the IGZO layer, and not expose a portion of the photoresist at the channel of the IGZO; and after utilizing wet-etching to form a pattern of IGZO layer, etching the portion of the photoresist at the contact region of the source/drain electrodes and the IGZO layer by dry etching, and the portion of the photoresist at the channel of the IGZO layer become thin to form the protective photoresist.

Wherein, after forming a n+IGZO region, further comprises a step of removing the protective photoresist.

In order to solve the above technical problems, another technical solution provided by the present invention is: an indium gallium zinc oxide (IGZO) transistor structure, comprising: a source electrode, a drain electrode, and an IGZO layer disposed on a substrate; a protect layer covered on a channel of the IGZO layer; a n+IGZO region formed by performing N-type doping at a contact region of the source electrode, the drain electrode and the IGZO layer; a gate insulation layer disposed on the protect layer and the n+IGZO region; and a gate electrode disposed on the gate insulation layer.

Wherein, the protect layer is silicon oxide.

The IGZO transistor structure and method for the same provided by the present invention can prevent the channel of the IGZO layer from damage during N-type doping through the plasma treatment. It can improve the ohmic contact and increase device characteristics.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the skilled persons of ordinary skill in the art without creative effort, it can also obtain other figures according to these figures.

DETAILED DESCRIPTION OF THE PREFERRED EMBODIMENT

Figure 1:
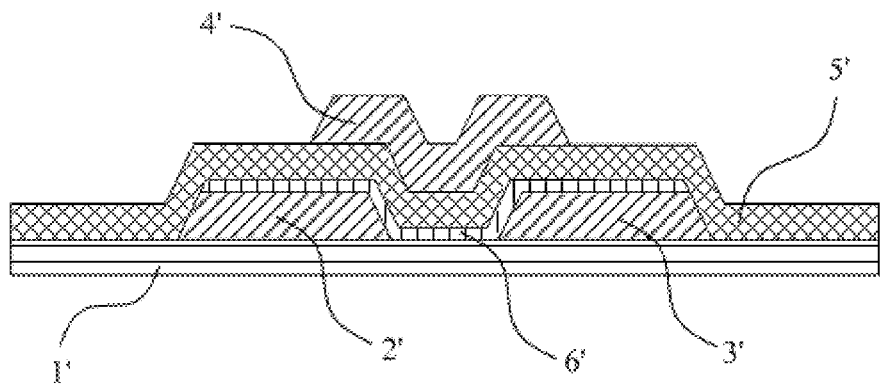
FIG. 1 is a schematic diagram of a standard top-gate-bottom-contact TFT.
Figure 2:
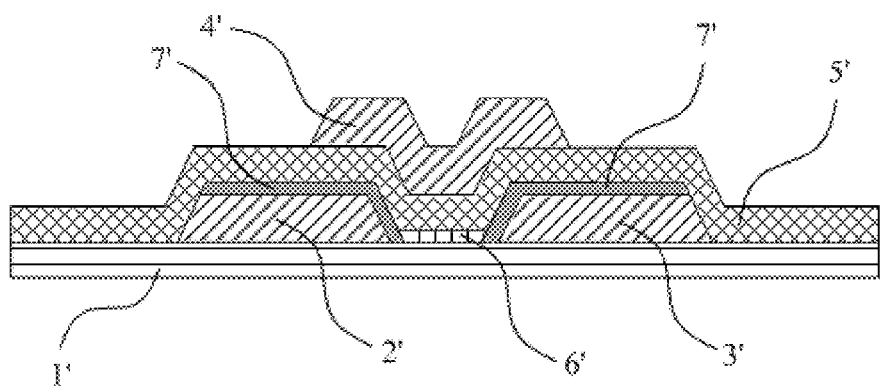
FIG. 2 is a schematic diagram of a top-gate-bottom-contact TFT after heavily doped.
Figure 3:
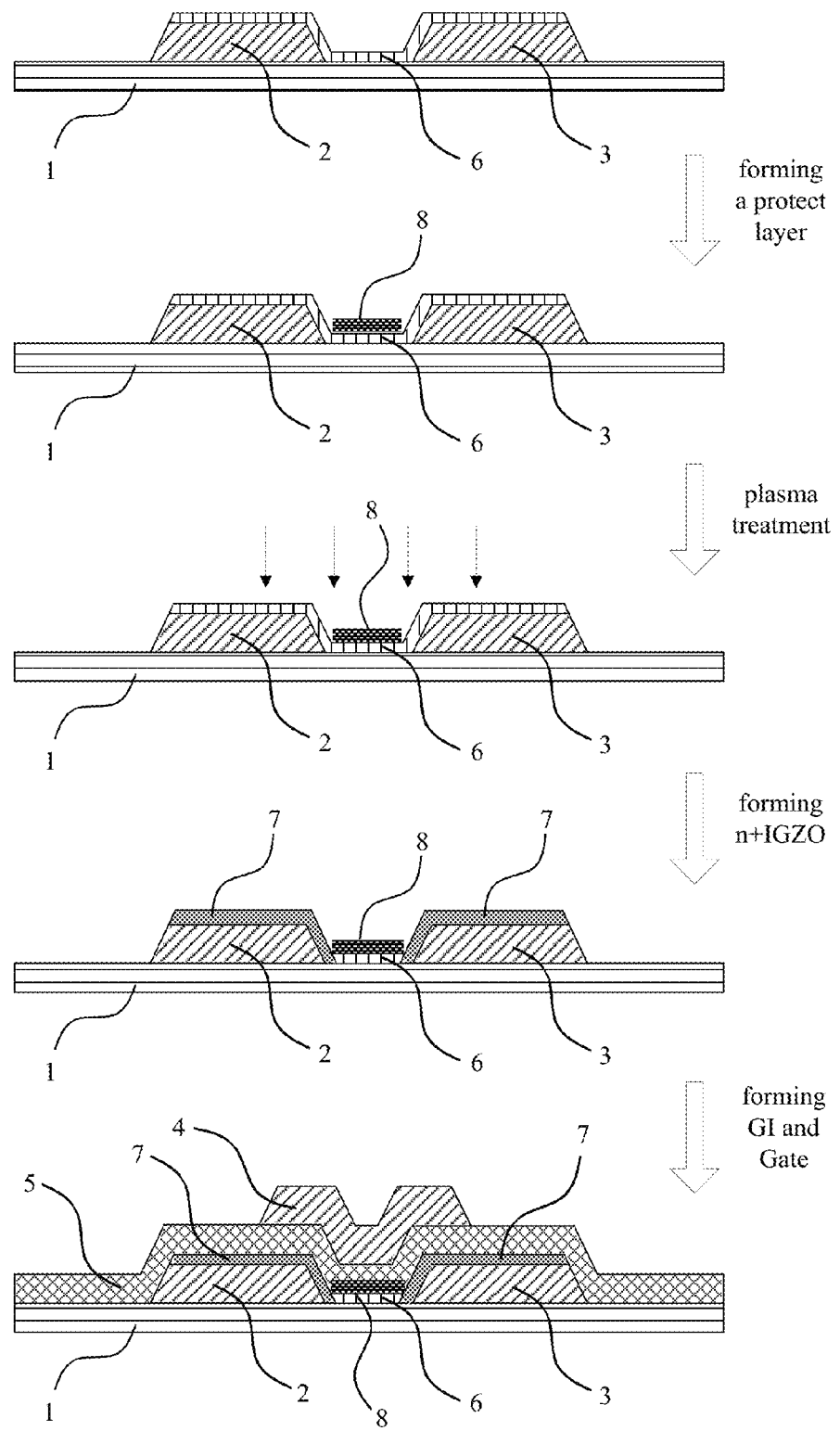
FIG. 3 is a schematic flow diagram of a manufacturing method for an IGZO transistor according to a first embodiment of the present invention.

With reference to FIG. 3, the first embodiment of the present invention provides a manufacturing method for an indium gallium zinc oxide (IGZO) semiconductor transistor, the method comprising:

Step S21, forming a source electrode 2, a drain electrode 3, and an IGZO layer 6 on a substrate 1;

Step S22, forming a protect layer 8 at a channel of the IGZO layer; Step S23, through plasma treatment, performing N-type doping to a contact region of the source/drain electrodes and the IGZO layer to form a n+IGZO region 7; and Step S24, forming a gate insulation layer 5 (GI) and a gate electrode 4.

This embodiment adds a manufacturing process of the protect layer to protect the channel of the IGZO layer. Specifically, in the step S22, it further comprises:

Step S221, depositing a silicon oxide (SiOx) thin film on the source/drain electrodes and the IGZO layer using CVD (Chemical Vapor Deposition);

Step S222, coating photoresist on the silicon oxide thin film;

Step S223, exposing and developing under a mask;

The result after exposing and developing is that the silicon oxide thin film on the channel of the IGZO layer is protected by the photoresist, and the other regions are exposed without the protection of the photoresist;

Step S224, etching the regions which are not protected by the photoresist; and

Step S225, removing the photoresist to form the protect layer.

In the present embodiment, it introduces a protect layer in the manufacturing process to prevent the channel of the IGZO layer from damage during the plasma treatment, and also ensure that when forming gate electrode in the subsequent process, it will not damage the channel of the IGZO layer when forming a film by plasma enhanced chemical vapor deposition (PECVD).

Furthermore, after the protect layer is formed, it will not be removed. In the subsequent process, the protect layer can continuously protect the channel of the IGZO layer. At the same time, because the channel has been protected, the subsequent tact time of the production line of a passivation layer is also greatly reduced.

Figure 4:
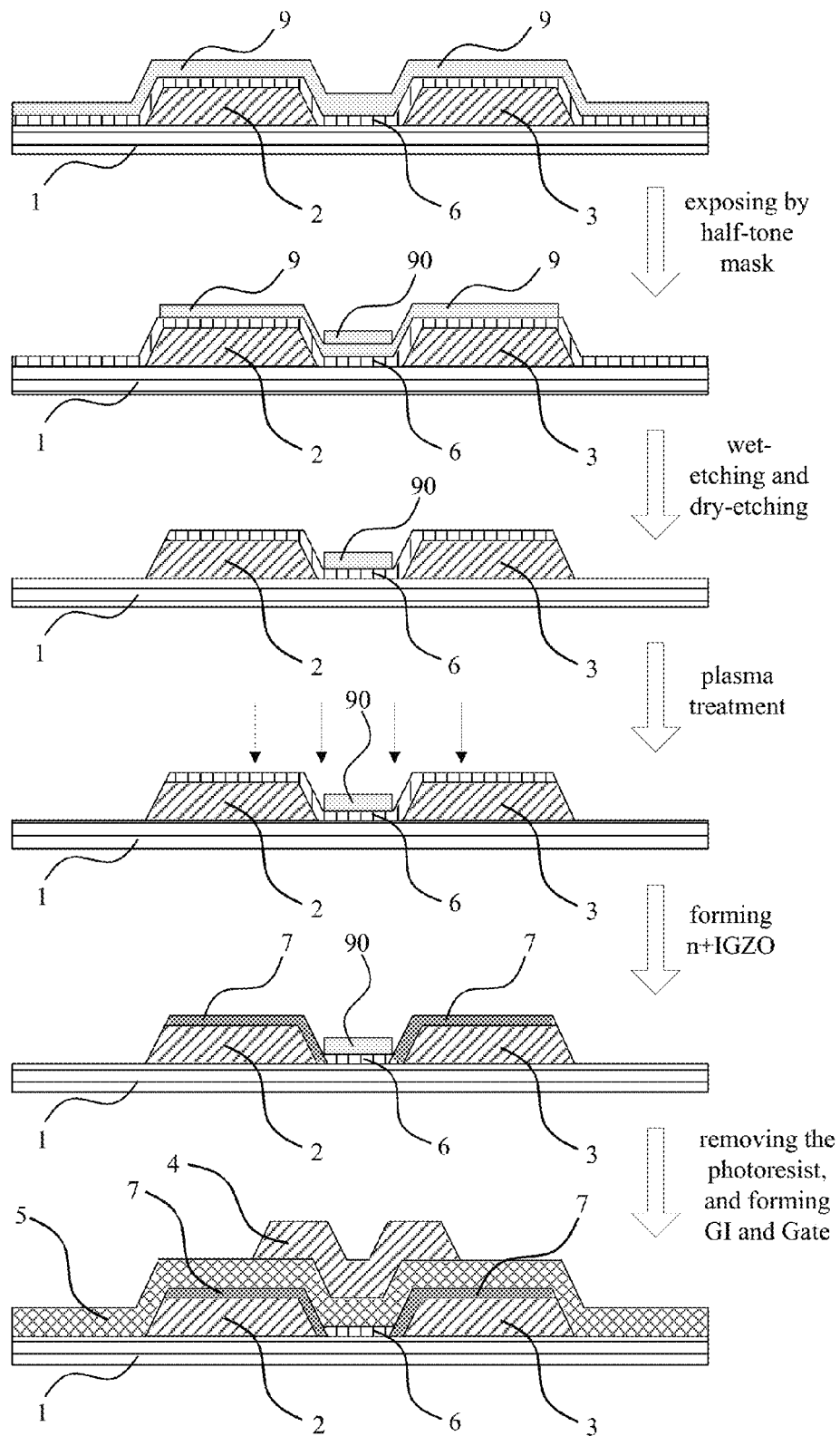
FIG. 4 is a schematic flow diagram of a manufacturing method for an IGZO transistor according to a second embodiment of the present invention.

With also reference to FIG. 4, the second embodiment of the present invention provides a manufacturing method for an indium gallium zinc oxide (IGZO) semiconductor transistor, the method comprising:

Step S31, forming a source electrode 2 and a drain electrode 3 on a substrate 1;

Step S32, forming an IGZO layer 6 on the source/drain electrodes and coating a photoresist 9;

Step S33, utilizing a half-tone mask to perform exposure for the photoresist to form a protective photoresist 90 at the channel of the IGZO layer 6;

Step S34, performing plasma treatment at a contact region of the source/drain electrodes and the IGZO layer 6 to form a n+IGZO region 7; and Step S35, forming a gate insulation layer 5 and a gate electrode 4.

Specifically, the step S33 further comprises:

Step S331, utilizing the half-tone mask to expose a portion of the photoresist at a contact region of the source/drain electrodes and the IGZO layer, and not expose a portion of the photoresist at the channel of the IGZO layer; and Step S332, after utilizing wet-etching to form a pattern of the IGZO layer, etching the portion of the photoresist at the contact region of the source/drain electrodes and the IGZO layer by dry etching, and the portion of the photoresist at the channel of the IGZO layer become thin to form the protective photoresist.

In the above-described step S331, the portion of the photoresist which is exposed becomes thin, and a thickness of the portion of the photoresist at the channel of the IGZO layer is thicker relative to the exposed portion. In the above-described step S332, when etching, the portion of the photoresist at the channel of the IGZO layer become thin in order to form a protective photoresist, which has the function of protecting the channel of the IGZO layer.

After the step S34, the further comprises a step S341, to remove the photoresist.

In this embodiment, through utilizing the half-tone mask such that the portion of the photoresist at the channel of the IGZO layer is not exposed. When etching, it can form a protective photoresist to protect the channel of the IGZO layer during the plasma treatment.

The first embodiment of the present invention utilizes SiOx as a protect layer, which requires to add a manufacturing process for the protect layer in order to perform the plasma treatment for IGZO. Therefore, it adds a mask, i.e., adds one film forming process, one lithography process, and one etching process. Comparing with the second embodiment of the present invention, it utilizes a half-tone mask, that is, part of exposure is strong, part of exposure is weak, and the remaining part is unexposed. The portion with strong exposure is not protected by the photoresist, and performing etching to form the IGZO pattern. Because the photoresist at the portion with weak exposure is thin, before performing the plasma treatment, it can be ashed by O2 plasma to expose the region waiting to be processed and then performing the plasma treatment. Therefore, the plasma treatment of the IGZO layer and the IGZO can be finished by single manufacturing process, which can eliminate one mask, one film forming process, one lithography process, and one etching process, which greatly reduces production costs and increase production capacity.

In addition, according to the method of the second embodiment of the present invention, it can also perform the plasma treatment at an inner side of the channel of the IGZO layer to improve the ohmic contact.

Figure 5:
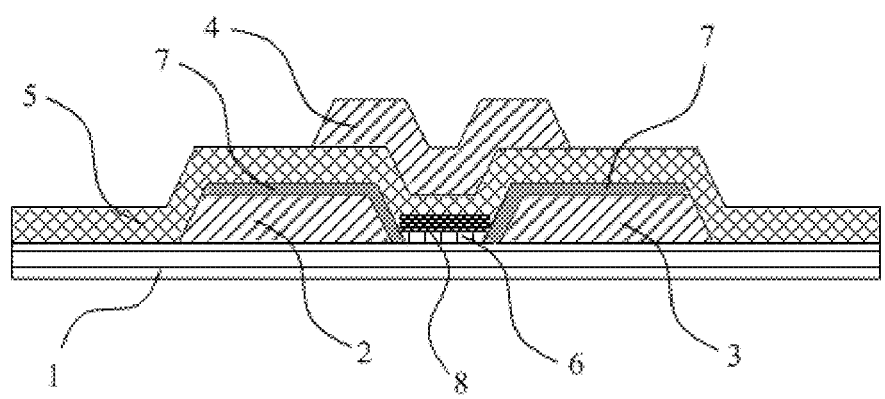
FIG. 5 is a schematic flow diagram of a manufacturing method for an IGZO transistor according to a third embodiment of the present invention.

With reference to FIG. 5, corresponding to the first embodiment of the present invention, a third embodiment of the present invention provides an IGZO transistor structure, comprising:

a source electrode 2, a drain electrode 3, and an IGZO layer 6 disposed on a substrate 1;

a protect layer 8 covered on a channel of the IGZO layer 6;

a n+IGZO region 7 formed by performing N-type doping at a contact region of the source electrode 2, the drain electrode 3 and the IGZO layer 6;

a gate insulation layer 5 disposed on the protect layer 8 and the n+IGZO region 7; and a gate electrode 4 disposed on the gate insulation layer 5.

Wherein the protect layer 8 is silicon oxide.

In this embodiment, because it disposes the protect layer 8 on the channel of the IGZO layer 6 in the IGZO transistor, it can prevent the channel of the IGZO layer 6 from damage during the plasma treatment, and PECVD film forming will not damage the channel of the IGZO layer 6. In addition, after forming the protect layer 8, it will not be removed. In the subsequent process, the protect layer 8 can continuously protect the channel of the IGZO layer 6. At the same time, because the channel has been protected, the subsequent tact time of the production line of a passivation layer is also greatly reduced.

The IGZO transistor structure and method for the same provided by the present invention can prevent the channel of the IGZO layer from damage during N-type doping through the plasma treatment. It can improve the ohmic contact and increase device characteristics.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for an indium gallium zinc oxide (IGZO) transistor, comprising:
    forming a source electrode, a drain electrode, and an IGZO layer on a substrate;
    forming a protect layer at a channel of the IGZO layer;
    performing N-type doping to a contact region of the source/drain electrodes and the IGZO layer to form a n+IGZO region through plasma treatment; and
    forming a gate insulation layer and a gate electrode.

2. The manufacturing method according to claim 1, wherein, in the step of forming a protect layer at a channel of the IGZO layer, further comprises:
    depositing a silicon oxide thin film on the source/drain electrodes and the IGZO layer using CVD (Chemical Vapor Deposition);
    coating a photoresist on the silicon oxide thin film;
    exposing and developing under a mask;
    etching a region which are not protected by the photoresist; and
    removing the photoresist to form the protect layer.

3. A manufacturing method for an indium gallium zinc oxide (IGZO) transistor, comprising:
    forming a source electrode and a drain electrode on a substrate;
    forming an IGZO layer on the source/drain electrodes and coating a photoresist;
    utilizing a half-tone mask to perform exposure for the photoresist to form a protective photoresist at a channel of the IGZO layer;
    performing plasma treatment at a contact region of the source/drain electrodes and the IGZO layer to form a n+IGZO region; and
    forming a gate insulation layer and a gate electrode.

4. The manufacturing method according to claim 3, wherein, in the step of utilizing a half-tone mask to perform exposure for the photoresist to form a protective photoresist at a channel of the IGZO layer, further comprises:
    utilizing the half-tone mask to expose a portion of the photoresist at a contact region of the source/drain electrodes and the IGZO layer, and not expose a portion of the photoresist at the channel of the IGZO; and
    after utilizing wet-etching to form a pattern of IGZO layer, etching the portion of the photoresist at the contact region of the source/drain electrodes and the IGZO layer by dry etching, and the portion of the photoresist at the channel of the IGZO layer become thin to form the protective photoresist.

5. The manufacturing method according to claim 4, wherein, after forming a n+IGZO region, further comprises a step of removing the protective photoresist.

* * * * *